(12) United States Patent
Rigg et al.

(10) Patent No.: US 7,091,124 B2
(45) Date of Patent: Aug. 15, 2006

(54) METHODS FOR FORMING VIAS IN MICROELECTRONIC DEVICES, AND METHODS FOR PACKAGING MICROELECTRONIC DEVICES

(75) Inventors: Sidney B. Rigg, Meridian, ID (US); Charles M. Watkins, Eagle, ID (US); Kyle K. Kirby, Boise, ID (US); Peter A. Benson, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 10/713,878

(22) Filed: Nov. 13, 2003

(65) Prior Publication Data
US 2005/0104228 A1    May 19, 2005

(51) Int. Cl.
*H01L 21/44* (2006.01)
(52) U.S. Cl. .................................. 438/667; 438/632
(58) Field of Classification Search ................ 438/632, 438/667
See application file for complete search history.

(56) References Cited

U.S. PATENT DOCUMENTS

| | | | |
|---|---|---|---|
| 3,345,134 A * | 10/1967 | Heymer et al. ............ | 423/411 |
| 5,107,328 A | 4/1992 | Kinsman | |
| 5,128,831 A | 7/1992 | Fox, III et al. | |
| 5,138,434 A | 8/1992 | Wood et al. | |
| 5,252,857 A | 10/1993 | Kane et al. | |
| 5,518,957 A | 5/1996 | Kim | |
| 5,593,927 A | 1/1997 | Farnworth | |
| 5,677,566 A | 10/1997 | King et al. | |
| 5,883,426 A | 3/1999 | Tokuno et al. | |
| 5,891,797 A | 4/1999 | Farrar | |
| 5,925,930 A | 7/1999 | Farnworth et al. | |
| 5,933,713 A | 8/1999 | Farnworth | |
| 5,938,956 A | 8/1999 | Hembree et al. | |
| 5,946,553 A | 8/1999 | Wood et al. | |
| 5,986,209 A | 11/1999 | Tandy | |
| 5,990,566 A | 11/1999 | Farnworth et al. | |
| 6,018,249 A | 1/2000 | Akram et al. | |
| 6,020,624 A | 2/2000 | Wood et al. | |
| 6,020,629 A | 2/2000 | Farnworth et al. | |
| 6,028,365 A | 2/2000 | Akram et al. | |
| 6,048,755 A | 4/2000 | Jiang et al. | |
| 6,051,878 A | 4/2000 | Akram et al. | |
| 6,066,514 A | 5/2000 | King et al. | |
| 6,072,233 A | 6/2000 | Corisis et al. | |

(Continued)

OTHER PUBLICATIONS

U.S. Appl. No. 10/928,598, filed Aug. 27, 2004, Kirby.

(Continued)

*Primary Examiner*—Howard Weiss
(74) *Attorney, Agent, or Firm*—Perkins Coie LLP (57) ABSTRACT

Microelectronic devices, methods for packaging microelectronic devices, and methods for forming vias and conductive interconnects in microfeature workpieces and dies are disclosed herein. In one embodiment, a method includes forming a bond-pad on a die having an integrated circuit, the bond-pad being electrically coupled to the integrated circuit. A conductive line is then formed on the die, the conductive line having a first end portion attached to the bond-pad and a second end portion spaced apart from the bond-pad. The method can further include forming a via or passage through the die, the bond-pad, and the first end portion of the conductive line, and depositing an electrically conductive material in at least a portion of the passage to form a conductive interconnect extending at least generally through the microelectronic device.

26 Claims, 8 Drawing Sheets

U.S. PATENT DOCUMENTS

| | | | |
|---|---|---|---|
| 6,072,236 A | 6/2000 | Akram et al. | |
| 6,080,291 A | 6/2000 | Woodruff et al. | |
| 6,081,429 A | 6/2000 | Barrett | |
| 6,089,920 A | 7/2000 | Farnworth et al. | |
| 6,097,087 A | 8/2000 | Farnworth et al. | |
| 6,107,122 A | 8/2000 | Wood et al. | |
| 6,114,240 A | 9/2000 | Akram et al. | |
| 6,130,474 A | 10/2000 | Corisis | |
| 6,148,509 A | 11/2000 | Schoenfeld et al. | |
| 6,150,717 A | 11/2000 | Wood et al. | |
| 6,153,924 A | 11/2000 | Kinsman | |
| 6,175,149 B1 | 1/2001 | Akram | |
| 6,188,232 B1 | 2/2001 | Akram et al. | |
| 6,201,304 B1 | 3/2001 | Moden | |
| 6,212,767 B1 | 4/2001 | Tandy | |
| 6,214,716 B1 | 4/2001 | Akram | |
| 6,225,689 B1 | 5/2001 | Moden et al. | |
| 6,228,548 B1 | 5/2001 | King et al. | |
| 6,232,666 B1 | 5/2001 | Corisis et al. | |
| 6,235,554 B1 | 5/2001 | Akram et al. | |
| 6,239,489 B1 | 5/2001 | Jiang | |
| 6,247,629 B1 | 6/2001 | Jacobson et al. | |
| 6,258,623 B1 | 7/2001 | Moden et al. | |
| 6,259,153 B1 | 7/2001 | Corisis | |
| 6,261,865 B1 | 7/2001 | Akram | |
| 6,265,766 B1 | 7/2001 | Moden | |
| 6,281,042 B1 | 8/2001 | Ahn et al. | |
| 6,281,577 B1 | 8/2001 | Oppermann et al. | |
| 6,285,204 B1 | 9/2001 | Farnworth | |
| 6,294,839 B1 | 9/2001 | Mess et al. | |
| 6,297,547 B1 | 10/2001 | Akram | |
| 6,303,981 B1 | 10/2001 | Moden | |
| 6,310,390 B1 | 10/2001 | Moden | |
| 6,326,698 B1 | 12/2001 | Akram | |
| 6,329,222 B1 | 12/2001 | Corisis et al. | |
| 6,331,221 B1 | 12/2001 | Cobbley | |
| 6,429,528 B1 | 8/2002 | King et al. | |
| 6,432,796 B1 | 8/2002 | Peterson | |
| 6,437,586 B1 | 8/2002 | Robinson | |
| 6,483,044 B1 | 11/2002 | Ahmad | |
| 6,548,376 B1 | 4/2003 | Jiang | |
| 6,552,910 B1 | 4/2003 | Moon et al. | |
| 6,560,117 B1 | 5/2003 | Moon | |
| 6,564,979 B1 | 5/2003 | Savaria | |
| 6,607,937 B1 | 8/2003 | Corisis | |
| 6,614,092 B1 | 9/2003 | Eldridge et al. | |
| 6,620,731 B1 * | 9/2003 | Farnworth et al. | 438/667 |
| 6,667,551 B1 * | 12/2003 | Hanaoka et al. | 257/750 |
| 6,703,310 B1 * | 3/2004 | Mashino et al. | 438/666 |
| 2005/0127478 A1 | 6/2005 | Hiatt et al. | |

OTHER PUBLICATIONS

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

King, B. et al., Optomec, Inc., M3D™ Technology, Maskless Mesoscale™ Materials Deposition, 5 pages, <http://www.optomec.com/downloads/M3D%20White%20Paper%20080502.pdf>, retrieved from the Internet on Jun. 17, 2005.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

* cited by examiner

METHODS FOR FORMING VIAS IN MICROELECTRONIC DEVICES, AND METHODS FOR PACKAGING MICROELECTRONIC DEVICES

CROSS-REFERENCE TO RELATED APPLICATION

This application is related to U.S. patent application Ser. No. 10/733,226 entitled MICROELECTRONIC DEVICES AND METHODS FOR FILLING VIAS IN MICROELECTRONIC DEVICES, filed concurrently herewith and incorporated herein in its entirety by reference.

TECHNICAL FIELD

The following disclosure relates generally to microelectronic devices and methods for packaging microelectronic devices and, more particularly, to methods for forming vias in microelectronic workpieces.

BACKGROUND

Conventional die-level packaged microelectronic devices can include a microelectronic die, an interposer substrate or lead frame attached to the die, and a moulded casing around the die. The die generally includes an integrated circuit and a plurality of bond-pads coupled to the integrated circuit. The bond-pads are typically coupled to terminals on the interposer substrate or lead frame and serve as external electrical contacts on the die through which supply voltage, signals, etc., are transmitted to and from the integrated circuit. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

One process for packaging a die with a ball-grid array at the die level includes (a) forming a plurality of dies on a semiconductor wafer, (b) cutting the wafer to separate or singulate the dies, (c) attaching individual dies to an interposer substrate, (d) wire-bonding the bond-pads of the dies to the terminals of the interposer substrate, and (e) encapsulating the dies with a suitable moulding compound. Mounting individual dies to interposer substrates or lead frames in the foregoing manner can be a time-consuming and expensive process. In addition, forming robust wire-bonds that can withstand the forces involved in moulding processes becomes more difficult as the demand for higher pin counts and smaller packages increases. Moreover, the process of attaching individual dies to interposer substrates or lead frames may damage the bare dies. These difficulties have made the packaging process a significant factor in the production of microelectronic devices.

Another process for packaging microelectronic devices is wafer-level packaging. In this process, a plurality of microelectronic dies are formed on a wafer, and then a redistribution layer is formed over the dies. The redistribution layer can include a dielectric layer and a plurality of exposed ball-pads forming arrays on the dielectric layer. Each ball-pad array is typically arranged over a corresponding die, and the ball-pads in each array are coupled to corresponding bond-pads of the die by conductive traces extending through the dielectric layer. After forming the redistribution layer on the wafer, discrete masses of solder paste are deposited onto the individual ball-pads. The solder paste is then reflowed to form small solder balls or "solder bumps" on the ball-pads. After forming the solder balls, the wafer is singulated to separate the individual microelectronic devices from each other.

Wafer-level packaging is a promising development for increasing efficiency and reducing the cost of microelectronic devices. By "pre-packaging" individual dies with a redistribution layer before cutting the wafers to singulate the dies, sophisticated semiconductor processing techniques can be used to form smaller arrays of solder balls. Additionally, wafer-level packaging is an efficient process that simultaneously packages a plurality of dies, thereby reducing costs and increasing throughput.

Packaged microelectronic devices such as those described above are used in cellphones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of microelectronic devices, however, becomes more difficult as the performance increases because higher performance typically means more integrated circuitry and bond-pads. This results in larger ball-grid arrays and thus larger footprints. One technique for increasing the component density of microelectronic devices within a given footprint is to stack one device on top of another.

Figure 1:
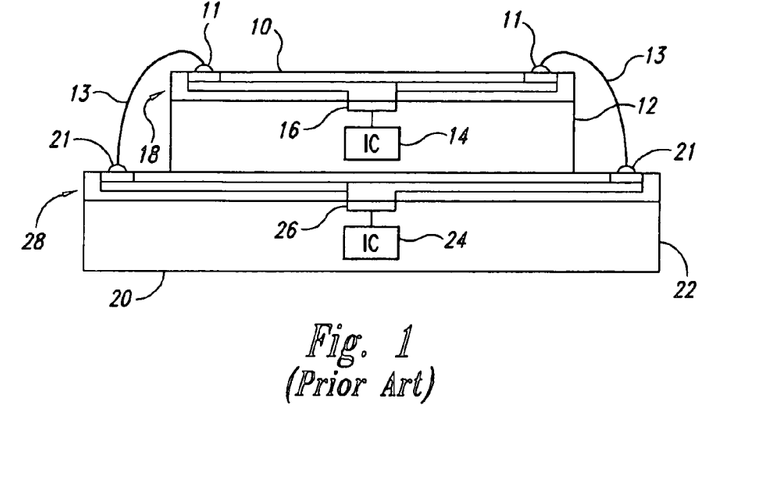
FIG. 1 schematically illustrates a first microelectronic device attached to a second microelectronic device in a stacked-die arrangement in accordance with the prior art.

FIG. 1 schematically illustrates a first microelectronic device 10 attached to a second microelectronic device 20 in a wire-bonded, stacked-die arrangement. The first microelectronic device 10 includes a die 12 having an integrated circuit 14 electrically coupled to a series of bond-pads 16. A redistribution layer 18 electrically couples a plurality of first solder balls 11 to corresponding bond-pads 16. The second microelectronic device 20 similarly includes a die 22 having an integrated circuit 24 electrically coupled to a series of bond-pads 26. A redistribution layer 28 electrically couples a plurality of second solder balls 21 to corresponding bond-pads 26. Wire-bonds 13 extending from the first solder balls 11 to the second solder balls 21 electrically couple the first microelectronic device 10 to the second microelectronic device 20.

The second solder balls 21 on the second microelectronic device 20 are positioned outboard of the first microelectronic device 10 to facilitate installation of the wire-bonds 13. As mentioned above, such installation can be a complex and/or expensive process. Forming the wire-bonds 13, for example, is not only difficult because it requires individual wires between each pair of solder balls, but it may not be feasible to form wire-bonds for the high-density, fine-pitch arrays of some high performance devices. In addition, positioning the second solder balls 21 outboard of the first microelectronic device 10 to accommodate the wire-bonds 13 undesirably increases the footprint of the stacked-die arrangement.

DETAILED DESCRIPTION

A. Overview

The following disclosure describes several embodiments of microelectronic devices, methods for packaging microelectronic devices, and methods for forming vias in dies and other substrates. One aspect of the invention is directed toward a method of manufacturing a microelectronic device having a die with an integrated circuit. In one embodiment, the method includes forming a bond-pad on the die electrically coupled to the integrated circuit, and forming a redistribution layer on the die. The redistribution layer can include a conductive line having a first end portion attached to the bond-pad and a second end portion spaced apart from the bond-pad. The method can further include forming a via or passage through the die, the bond-pad, and the first end portion of the conductive line. An electrically conductive material can then be deposited into at least a portion of the passage to provide a conductive interconnect extending through the die that is electrically coupled to the bond-pad and the conductive line.

In one aspect of this embodiment, the method can further include cleaning the passage and applying a passivation layer to at least a portion of the passage before depositing the electrically conductive material into the passage. In one embodiment, the passivation layer can at least generally insulate the die from the electrically conductive material filling the passage. In another aspect of this embodiment, the method can further include applying a TiCL$_4$ TiN layer to at least a portion of the passage, and applying a Ni layer over at least a portion of the TiCL$_4$ TiN layer before depositing the electrically conductive material into the passage.

Another aspect of the invention is directed toward a set of microelectronic devices. In one embodiment, the microelectronic device set includes a first microelectronic device stacked on a second microelectronic device in a stacked-die arrangement. The first microelectronic device can include a first die with a first integrated circuit, a first bond-pad electrically coupled to the first integrated circuit, and a passage through the first die and the first bond-pad. The first die also includes a metal interconnect in the passage and coupled to the first bond-pad to form a conductive link extending at least partially through the first microelectronic device. The second microelectronic device can include a second die with a second integrated circuit and a second bond-pad electrically coupled to the second integrated circuit. The second bond-pad can be electrically coupled to the conductive link of the first microelectronic device.

Many specific details of the present invention are described below with reference to semiconductor devices. The term "microfeature workpiece," however, as used throughout this disclosure includes substrates upon which and/or in which microelectronic devices, micromechanical devices, data storage elements, read/write components, and other features are fabricated. For example, such microelectronic workpieces can include semiconductor wafers (e.g., silicon or gallium arsenide wafers), glass substrates, insulated substrates, and many other types of substrates. The feature signs in microfeature workpieces can include very small features of 0.11 µm or less, but larger features are also included on microfeature workpieces.

Specific details of several embodiments of the invention are described below with reference to microelectronic dies and other microelectronic devices in order to provide a thorough understanding of such embodiments. Other details describing well-known structures often associated with microelectronic devices are not set forth in the following description to avoid unnecessarily obscuring the description of the various embodiments. Persons of ordinary skill in the art will understand, however, that the invention may have other embodiments with additional elements or without several of the elements shown and described below with reference to FIGS. 2–7.

In the Figures, identical reference numbers identify identical or at least generally similar elements. To facilitate the discussion of any particular element, the most significant digit or digits of any reference number refer to the Figure in which that element is first introduced. For example, element 210 is first introduced and discussed with reference to FIG. 2.

B. Embodiments of Microfeature Workpieces

Figure 2:
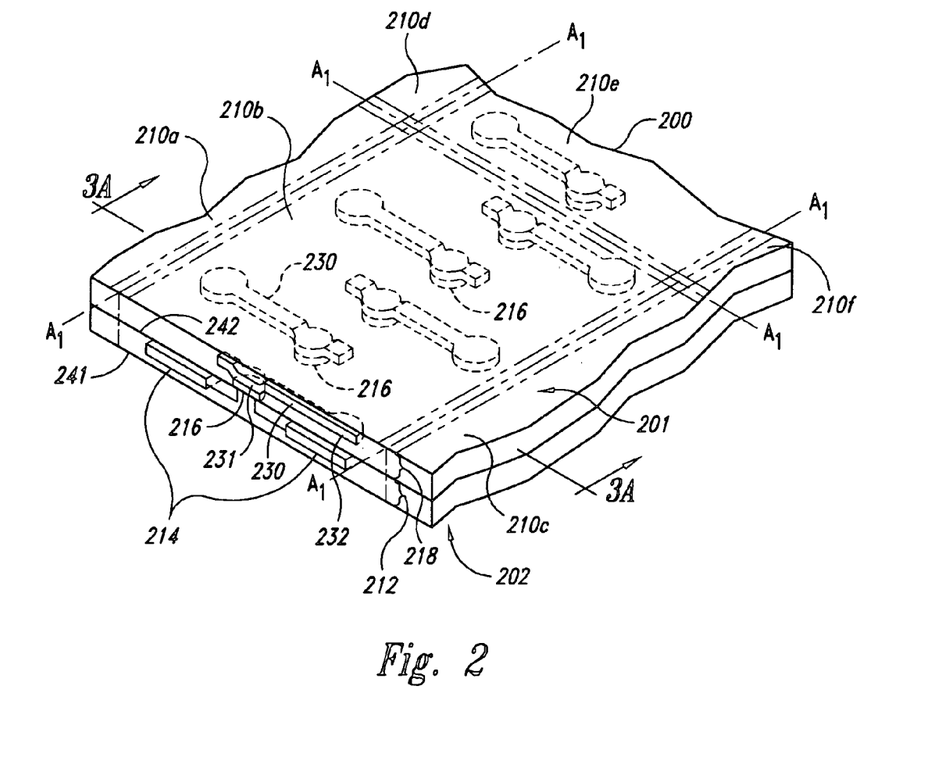
FIG. 2 is a cut-away isometric view of a microfeature workpiece configured in accordance with an embodiment of the invention.

FIG. 2 is a cut-away isometric view of a wafer or microfeature workpiece 200 in accordance with an embodiment of the invention. In one aspect of this embodiment, the microfeature workpiece 200 includes a front side 201, a back side 202, and a plurality of microelectronic devices 210 (identified individually as microelectronic devices 210a–f). Each microelectronic device 210 can include a microelectronic die 212 and a redistribution layer 218 (RDL 218) formed on the die 212. Each die 212 can include an integrated circuit 214 (shown schematically), a first surface 241, a second surface 242, and a plurality of metallic and/or conductive bond-pads 216 electrically coupled to the integrated circuit 214. The RDL 218 can include a plurality of metallic and/or conductive lines 230 that each have a first end portion 231 electrically coupled to a corresponding bond-pad 216, a second end portion 232 spaced outwardly from the first end portion 231, and a trace between the first and second end portions 231 and 232. As described in greater detail below, the second end portions 232 in one embodiment can have ball-pads configured to receive solder balls for electrically connecting the microelectronic devices 210 to other devices.

In the embodiment illustrated in FIG. 2, the processing of the microelectronic devices 210 has not been completed. As described below with reference to FIGS. 3A–6, additional processing can be carried out on the microfeature workpiece 200 to configure or package the individual microelectronic devices 210 for use in an electronic device or product. After this additional processing is complete, the microfeature workpiece 200 is cut along lines $A_1$—$A_1$ to singulate the microelectronic devices 210.

Figure 3A:
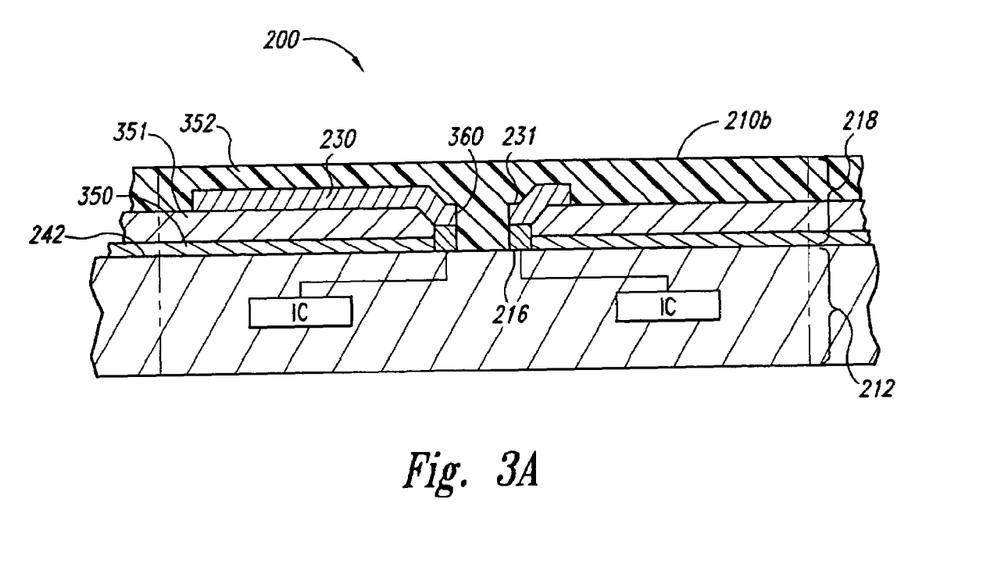
FIGS. 3A–3G are schematic cross-sectional views illustrating various stages in a method of forming a conductive interconnect in a microelectronic device in accordance with an embodiment of the invention.

FIGS. 3A–3G illustrate various stages in a method of forming a conductive interconnect in the microelectronic device 210b in accordance with an embodiment of the invention. FIG. 3A, more specifically, is a schematic side cross-sectional view of the microfeature workpiece 200 taken substantially along line 3A—3A in FIG. 2. In one aspect of this embodiment, the RDL 218 includes a first passivation layer 350 applied to the second surface 242 of the die 212, and a first dielectric layer 351 applied over the first passivation layer 350. The first dielectric layer 351 can be removed around the bond-pad 216 by etching or another known process to expose the bond-pad 216. Exposing the bond-pad 216 in this manner allows the fist end portion 231 of the conductive line 230 to contact the bond-pad 216 when the conductive line 230 is formed over the first dielectric layer 351.

After forming the conductive line 230, a first hole 360 is formed through the first end portion 231 of the conductive line 230 and the bond-pad 216. In one embodiment, the first hole 360 can be formed by an etching process. In other embodiments, the first hole 360 can be formed using other suitable methods. Additionally, a second dielectric layer 352 is applied over the microfeature workpiece 200 to cover the conductive line 230 and fill the first hole 360.

In one embodiment, the first and second dielectric layers 351, 352 include a polyimide material. In other embodiments, the first and second dielectric layers 351, 352 include other nonconductive and/or insulative materials. The first passivation layer 350 and/or one or more subsequent passivation layers can include a low temperature chemical vapor deposition (low temperature CVD) material, such as tetra-ethylorthosilicate (TEOS). In other embodiments, one or more of the passivation layers on the microfeature workpiece 200 can include parylene and/or other suitable materials, such as silicon oxide ($SiO_x$) or silicon nitride ($Si_3N_4$). The foregoing list of passivation and dielectric material options is not exhaustive. Accordingly, in other embodiments, it is expected that other suitable materials and processes can be used to form one or more of the layers discussed herein. In addition, it is further expected that, in yet other embodiments, one or more of the layers described above with reference to FIG. 3A, or described below with reference to subsequent Figures, may be omitted.

FIG. 3A illustrates one method for providing an RDL on a die in accordance with the present invention. In other embodiments, other methods resulting in other RDL/die configurations can be used. Accordingly, as those of ordinary skill in the art will recognize, the methods described in detail below for forming vias in microelectronic devices are not limited to the particular RDL/die configuration illustrated in FIG. 3A.

Figure 3B:
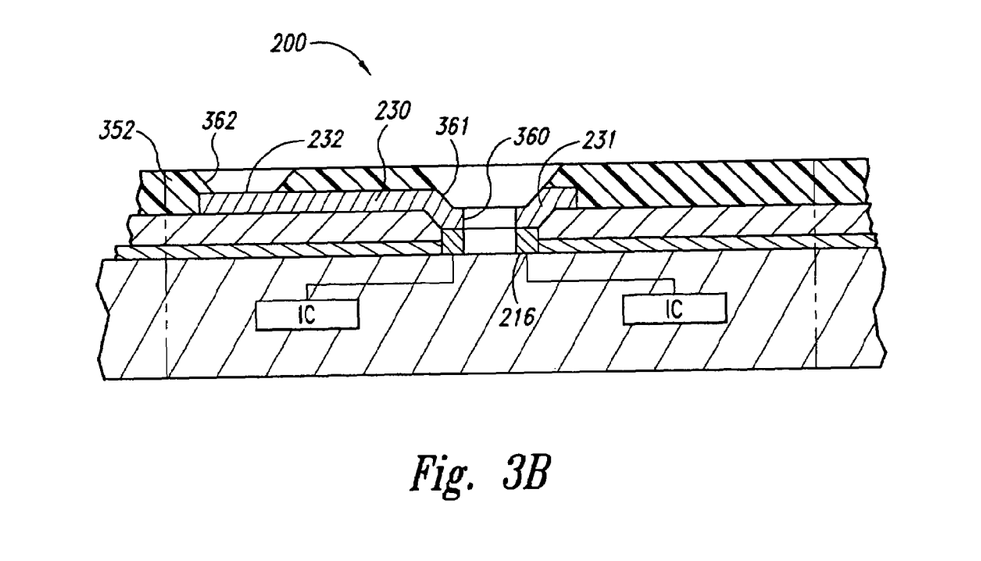

FIGS. 3B–3G are schematic side cross-sectional views similar to FIG. 3A showing the microfeature workpiece 200 in subsequent stages of forming the interconnect. FIG. 3B, for example, is a schematic side cross-sectional view of the microfeature workpiece 200 after a second hole 361 and a third hole 362 have been formed through the second dielectric layer 352. In one aspect of this embodiment, forming the second hole 361 includes removing the second dielectric layer 352 from the first hole 360, thereby exposing the bond-pad 216 and the first end portion 231 of the conductive line 230. The third hole 362 is formed through the second dielectric layer 352 to expose part of the second end portion 232 of the conductive line 230. In one aspect of this embodiment, the second and third holes 361, 362 can be formed by dry-etching or by other suitable methods known to those of skill in the semiconductor processing art.

Figure 3C:
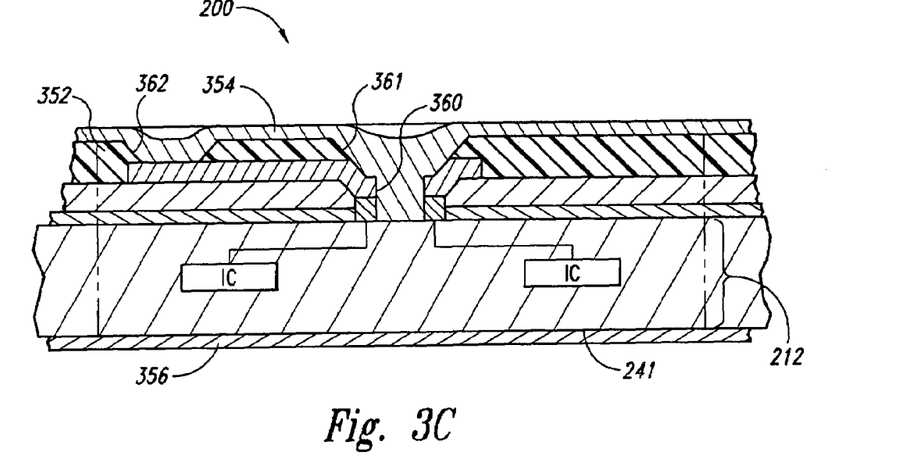

FIG. 3C illustrates the microfeature workpiece 200 of FIG. 3B after application of a second passivation layer 354 and a third passivation layer 356. The second passivation layer 354 is applied over the second dielectric layer 352 such that it is deposited into the first hole 360, the second hole 361, and the third hole 362. The third passivation layer 356 is applied to the first surface 241 of the die 212. In one aspect of this embodiment, the second and third passivation layers 354, 356 can include parylene. In other embodiments, the second passivation layer 354 can include other materials, such as an oxide.

Figure 3D:
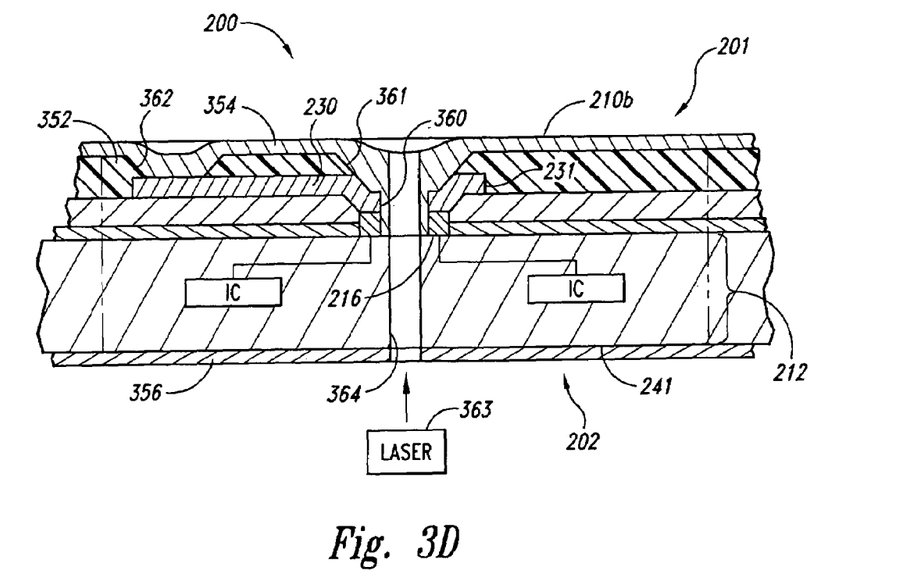

Referring next to FIG. 3D, after application of the second and third passivation layers 354, 356, a laser 363 (shown schematically) cuts a passage or through-hole 364 through the microelectronic device 210b. In one aspect of this embodiment, the through-hole 364 extends at least through the die 212, the bond-pad 216, and the first end portion 231 of the conductive line 230. For example, in the illustrated embodiment, the through-hole 364 extends entirely through the third passivation layer 356, the die 212, and the second passivation layer 354. The laser 363 generally cuts from the back side 202 of the microfeature workpiece 200 toward the front side 201, but it can conceivably cut from the front side 201 toward the back side 202. Further, the laser 363 can be aligned with respect to the bond-pad 216 using a pattern recognition system or other known alignment system. In other embodiments, the through-hole 364 can be formed using other suitable methods known to those of skill in the art. For example, in another embodiment, it is expected that the through-hole 364 can be formed by a suitable etching or drilling process.

After forming the through-hole 364, it is cleaned to remove ablation (i.e., slag) and/or other undesirable byproducts resulting from the laser cut. In one embodiment, the through-hole 364 is cleaned using a wet-etch process. In this embodiment, the portion of the second passivation layer 354 remaining in the first hole 360 protects the bond-pad 216 and the first end portion 231 of the conductive line 230 from the wet-etch chemistry used to clean the slag from the die area of through-hole 364. This feature allows a single cleaning process/chemistry to clean the slag from the via for the interconnect without having to use a second cleaning process to clean residue on the bond-pad 216 and first end portion 231. In other embodiments, the through-hole 364 can be cleaned using other methods. For example, in some embodiments (one of which is described in greater detail below), cleaning agents that do not attack the metal of the bond-pad 216 can be used to clean the through-hole 364 so that the second passivation layer 354 is not needed to protect the bond-pad 216. One such cleaning agent may include 6% TMAH: propylene glycol for removing laser ablation. Alternatively, in certain other embodiments, the through-hole 364 can remain uncleaned after formation.

Figure 3E:
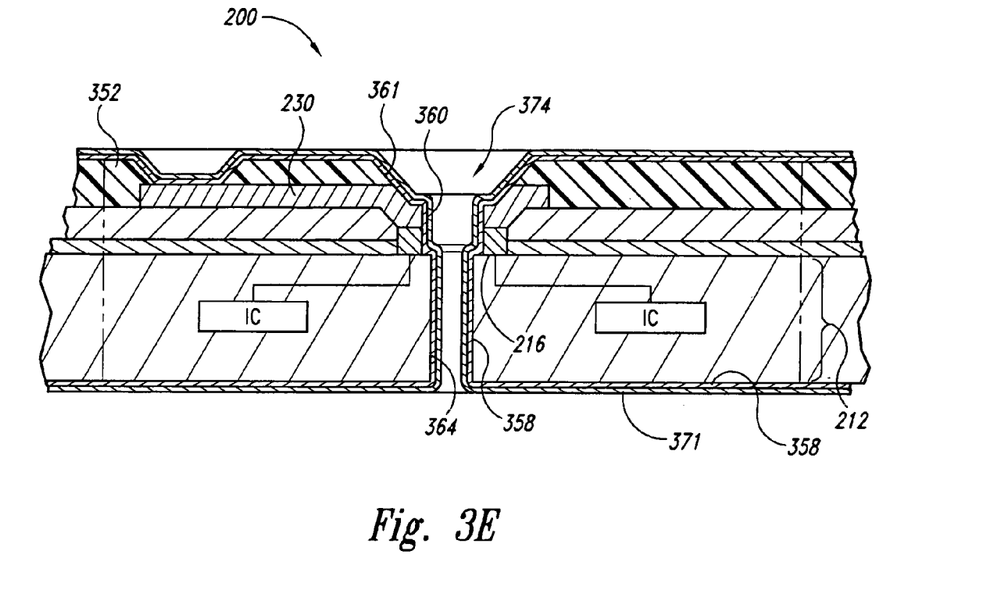

Referring to FIG. 3E, after cleaning the through-hole 364, a fourth passivation layer 358 is applied to the microfeature workpiece 200 to at least cover the portion of the die 212 exposed by the through-hole 364. The fourth passivation layer 358 can be applied in a number of different ways. For example, in the illustrated embodiment, the second and third passivation layers 354, 356 (FIG. 3D) are removed from the microfeature workpiece 200, and the fourth passivation layer 358 is then applied to the entire workpiece so that it covers the exposed portions of the die 212, the bond-pad 216, the conductive line 230, and the second dielectric layer 352. In one aspect of this embodiment, the fourth passivation layer 358 can include a low temperature CVD oxide. In other embodiments, the fourth passivation layer 358 can include other suitable materials. The fourth passivation layer 358 can insulate the die 212 from electrical leakage after the through-hole 364 has been filled with conductive metal (not shown) as described in greater detail below.

After application of the fourth passivation layer 358, a first metal layer 371 is applied to the microfeature workpiece 200. In the illustrated embodiment, the first metal layer 371 covers the entire fourth passivation layer 358. In one aspect of this embodiment, the first metal layer 371 can include $TiCL_4$ TiN. In other embodiments, the first metal layer 371 can include other suitable materials known to those of skill in the art. For ease of reference, the passage formed by the through-hole 364, the first hole 360, and the second hole 361 is referred to herein as a via or passage 374 extending through the microfeature workpiece 200.

Figure 3F:
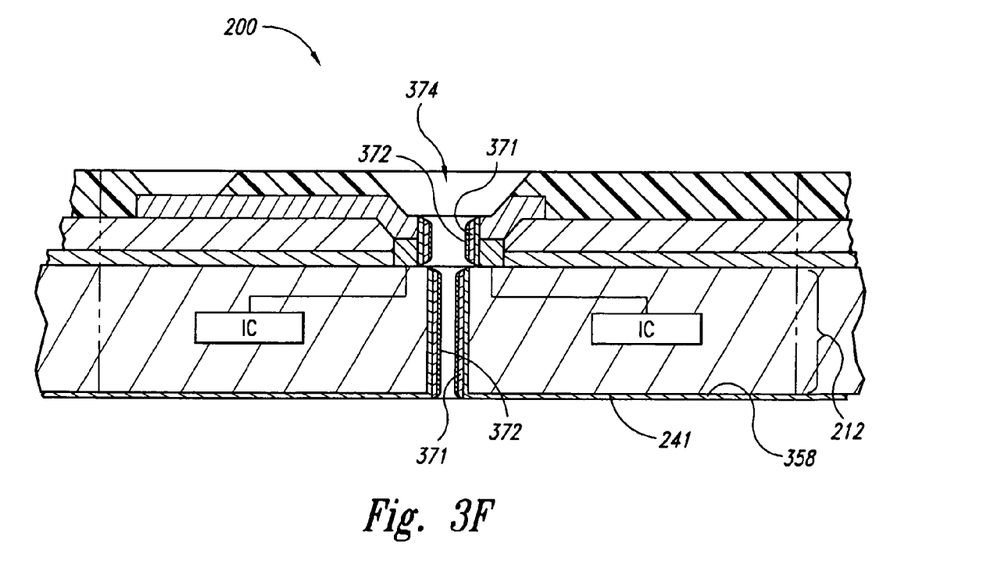

Referring next to FIG. 3F, the first metal layer 371 is removed from the horizontal and diagonal surfaces of the microfeature workpiece 200. The fourth passivation layer 358 is similarly removed from these surfaces, except that it is left on the first surface 241 of the die 212. In one embodiment, the first metal layer 371 and the fourth passivation layer 358 can be removed from these surfaces by a suitable etching process, such as a "dry etch" or "spacer etch" process that only removes material from horizontal surfaces and surfaces having horizontal components. In other embodiments, other processes can be used to remove these layers from the designated surfaces.

After the first metal layer 371 and the fourth passivation layer 358 have been removed from the horizontal and diagonal surfaces of the microfeature workpiece 200 as described above, a second metal layer 372 is applied to the first metal layer 371. The second metal layer 372 can act as a wetting agent to facilitate flowing and/or adhesion of subsequent metals in the passage 374. In one embodiment, for example, the second metal layer 372 can include Ni that is applied over the $TiCL_4$ TiN of the first metal layer 371 in an electroless plating operation. In this embodiment, when the $TiCL_4$ TiN is activated by an HF:Pd wet dip, it provides nucleation for the Ni during the plating process. In other embodiments, the passage 374 can be coated with other suitable materials using other methods or, alternatively, one or more of the first and second metal layers 371, 372 may be omitted.

Figure 3G:
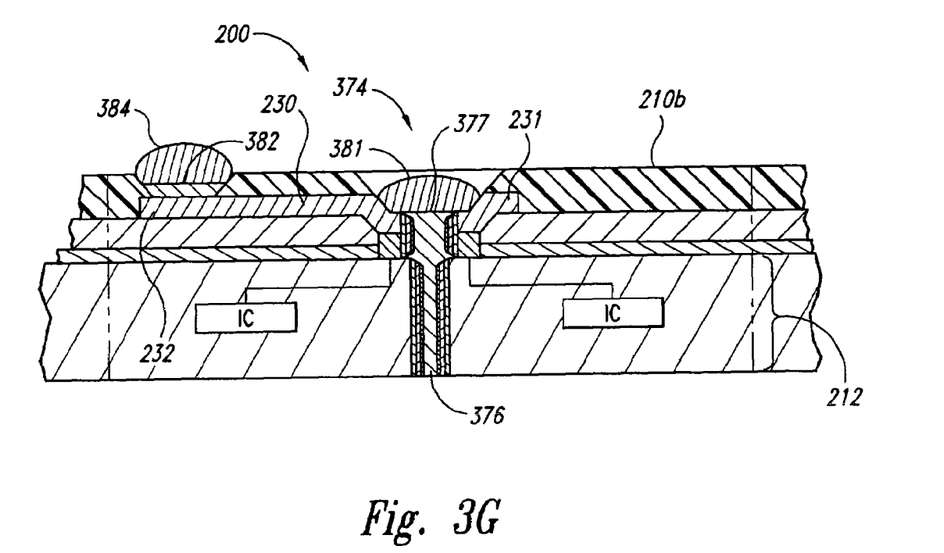

Referring next to FIG. 3G, the passage 374 receives a metal fill 376 to form a conductive interconnect 377 extending through the microelectronic device 210b. In one aspect of this embodiment, the metal fill 376 can include solder or electroplating material. In other embodiments, other electrically conductive materials can be used to fill the passage 374. After filling the passage 374, a first cap 381 can be formed before depositing the fill 376 in the passage 374, or in another embodiment the cap 381 can be applied to the interconnect 377 so that it makes intimate contact with the first end portion 231 of the conductive line 230. A second cap 382 can be applied to the second end portion 232 of the conductive line 230. In one embodiment, the first and second caps 381, 382 can include Ni applied in an electroless plating process. In other embodiments, the first and second caps 381, 382 can include other wetting agents and/or other materials. Alternatively, the first cap 381 and the second cap 382 can be omitted. In another aspect of this embodiment, a solder ball 384 is attached to the second cap 382 to provide an external connection to other electronic devices in a subsequent assembly operation.

In addition to requiring only a single cleaning process for the through-hole 364, another feature of aspects of the embodiments described above with reference to FIGS. 3A–3G is that the passage 374 extends through the entire microfeature workpiece 200. One advantage of this feature is that it makes the passage 374 easier to clean and fill than would otherwise be the case if the passage were "blind" (i.e., a passage that extends only partially through the workpiece). For example, in certain applications where the passage 374 has an aspect ratio of 25–30:1 or greater, a blind passage is difficult to fill with metallic materials using known physical vapor deposition (PVD), atomic level deposition (ALD), or plating processes. The passage 374 mitigates this problem.

Figure 4:
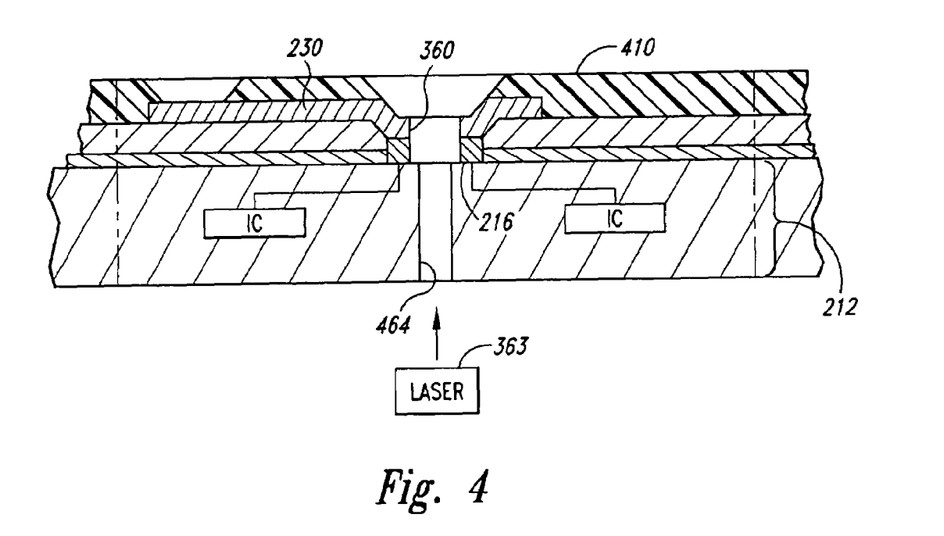
FIG. 4 is a schematic cross-sectional view illustrating a stage in a method of forming a conductive interconnect in a microelectronic device in accordance with another embodiment of the invention.

FIG. 4 illustrates a stage in a method of forming a conductive interconnect in a microelectronic device 410 in accordance with another embodiment of the invention. In one aspect of this embodiment, the first part of this method is at least generally similar to the steps described above with reference to FIGS. 3A–3B, and results in the workpiece configuration illustrated in FIG. 3B. The second part of this method, however, differs from that described above with reference to FIGS. 3C–3G in that no passivation is deposited into the first hole 360 before the laser 363 cuts a through-hole 464 through the die 212. Instead, the through-hole 464 is cut and cleaned in the absence of any protection over the exposed metal of the bond-pad 216 and the conductive line 230. In the absence of such protection, the cleaning agents may be limited to those chemistries that do not attack or otherwise degrade the metal of the bond-pad 216 or the conductive line 230. For example, in one embodiment, such cleaning agents can include tetramethylammonium hydroxide (TMAH). In other embodiments, other cleaning agents can be used to clean the through-hole 464. After the through-hole 464 has been suitably cleaned, the microelectronic device 410 can undergo additional packaging steps that are at least generally similar to those described above with reference to FIGS. 3E–3G to arrive at the configuration illustrated in FIG. 3G.

Figure 5A:
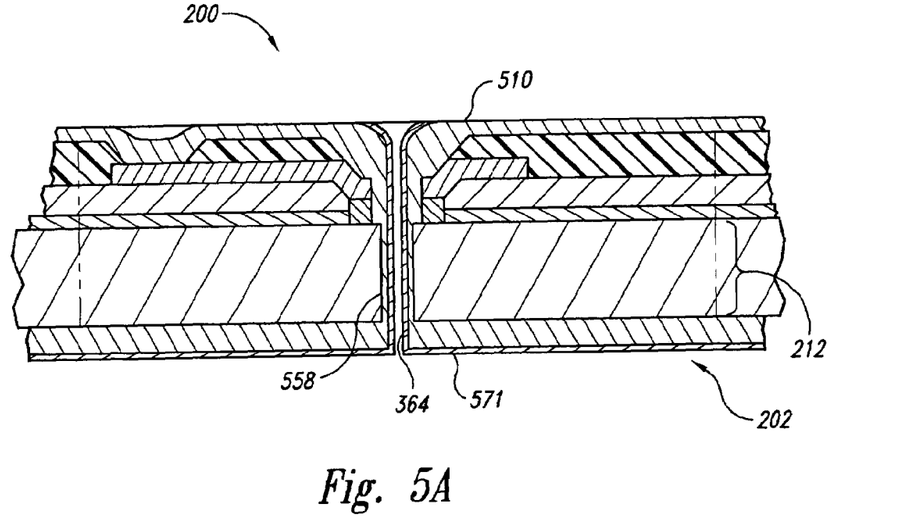
FIGS. 5A–5C are schematic cross-sectional views illustrating various stages in a method of forming a conductive interconnect in a microelectronic device in accordance with a further embodiment of the invention.
Figure 5B:
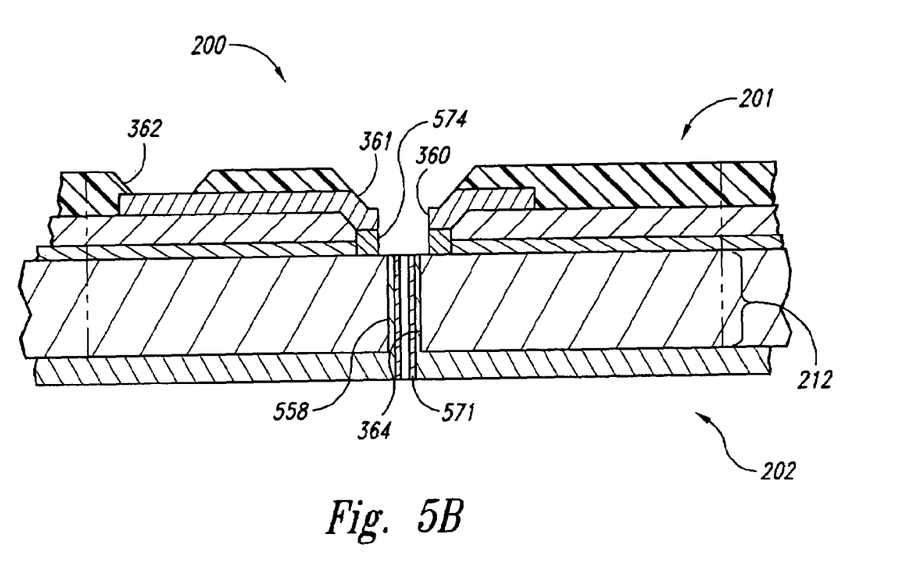
Figure 5C:
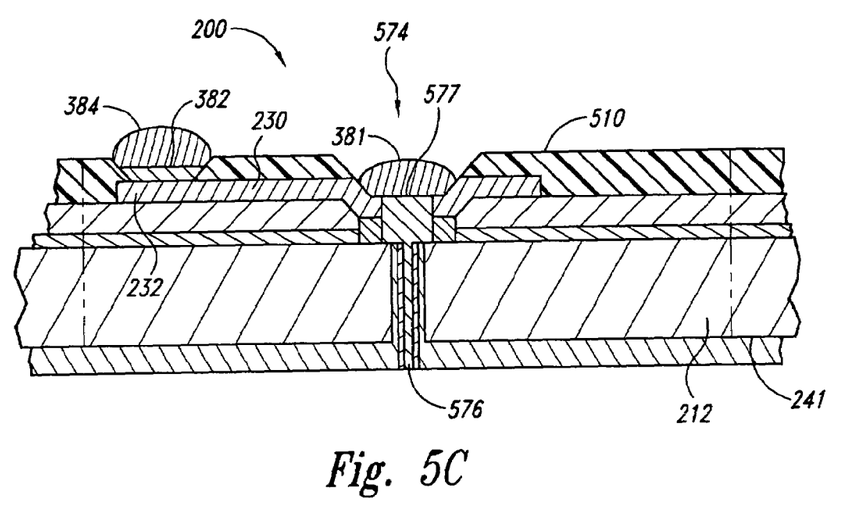

FIGS. 5A–5C illustrate various stages in a method of forming a conductive interconnect in a microelectronic device 510 in accordance with another embodiment of the invention. Referring first to FIG. 5A, the first part of this method can be at least generally similar to the steps described above with reference to FIGS. 3A–3D to arrive at the workpiece configuration illustrated in FIG. 3D. In a further aspect of this embodiment, however, an additional passivation layer 558 is applied to the portion of the die 212 left exposed by the through-hole 364. In addition, after the passivation layer 558 has been applied, a first metal layer 571 is applied to the through-hole 364 and to the back side 202 of the microfeature workpiece 200. In one embodiment, the first metal layer 571 can include $TiCL_4$ TiN. In other embodiments, the first metal layer 571 can include other suitable materials.

Referring next to FIG. 5B, the first metal layer 571 is removed from the back side 202 of the microfeature workpiece 200, leaving the passivation layer 558 covering this surface. Additionally, the first metal layer 571 and the second passivation layer 354 (FIG. 3D) are removed from the front side 201 of the microfeature workpiece 200 to expose the first hole 360, the second hole 361, and the third hole 362. The portions of the passivation layer 558 and the first metal layer 571 in the through-hole 364 remain after the other layers have been removed to insulate the die 212 from electrical leakage during use. For ease of reference, the passage formed by the through-hole 364, the first hole 360, and the second hole 361 is referred to herein as a via or passage 574 extending through the microfeature workpiece 200.

Referring next to FIG. 5C, the passage 574 receives a metal fill 576 to form a conductive interconnect 577 extending through the microelectronic device 510. In one aspect of this embodiment, the interconnect 577 can include solder or electroplating material. In other embodiments, other electrically conductive materials can be used to fill the passage 574. After filling the passage 574, the first cap 381 can be applied to the interconnect 577, and the second cap 382 can be applied to the second end portion 232 of the conductive line 230 to receive the solder ball 384.

The embodiments described above with reference to FIGS. 3A–5C include three methods forming and/or filling through-holes in microfeature workpieces that extend through bond-pads and/or associated RDLs. In other embodiments, other methods can be used to form and/or fill such through-holes. Accordingly, the present invention is not limited to the particular filling methods described above, but extends to other methods for providing a conductive material in a through-hole formed in accordance with the present invention.

Figure 6:
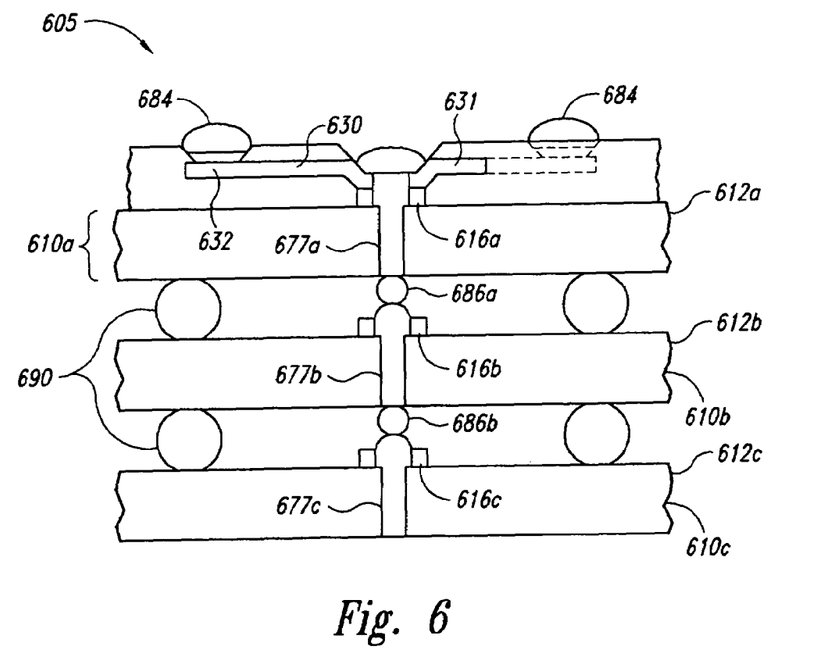
FIG. 6 is a schematic side cross-sectional view of a microelectronic device set configured in accordance with an embodiment of the invention.

FIG. 6 is a schematic side cross-sectional view of a microelectronic device set 605 configured in accordance with an embodiment of the invention. In one aspect of this embodiment, the microelectronic device set 605 includes a plurality of microelectronic devices 610 (individually identified as a first microelectronic device 610a, a second microelectronic device 610b, and a third microelectronic device 610c) interconnected in a stacked-die arrangement. The first microelectronic device 610a can be at least generally similar to the packaged microelectronic devices 210b and 510 discussed above and illustrated in FIGS. 3G and 5C, respectively. Accordingly, the first microelectronic device 610a can include a plurality of interconnects 677a extending through a die 612a, corresponding bond-pads 616a, and corresponding first end portions 631 of conductive lines 630. In addition, the first microelectronic device 610a can further include solder balls 684 deposited on second end portions 632 of the conductive lines 630 for electrically connecting the microelectronic device set 605 to other electronic devices. The second and third microelectronic devices 610b–c can similarly include interconnects 677b–c extending through dies 612b–c and bond-pads 616b–c, respectively.

In another aspect of this embodiment, first solder balls 686a can be used to electrically connect the first microelectronic device 610a to the second microelectronic device 610b, and second solder balls 686b can in turn be used to electrically connect the second microelectronic device 610b to the third microelectronic device 610c. A suitable adhesive 690 or other compound can also be used to structurally attach the microelectronic devices 610 together in the illustrated stacked-die configuration.

Figure 7:
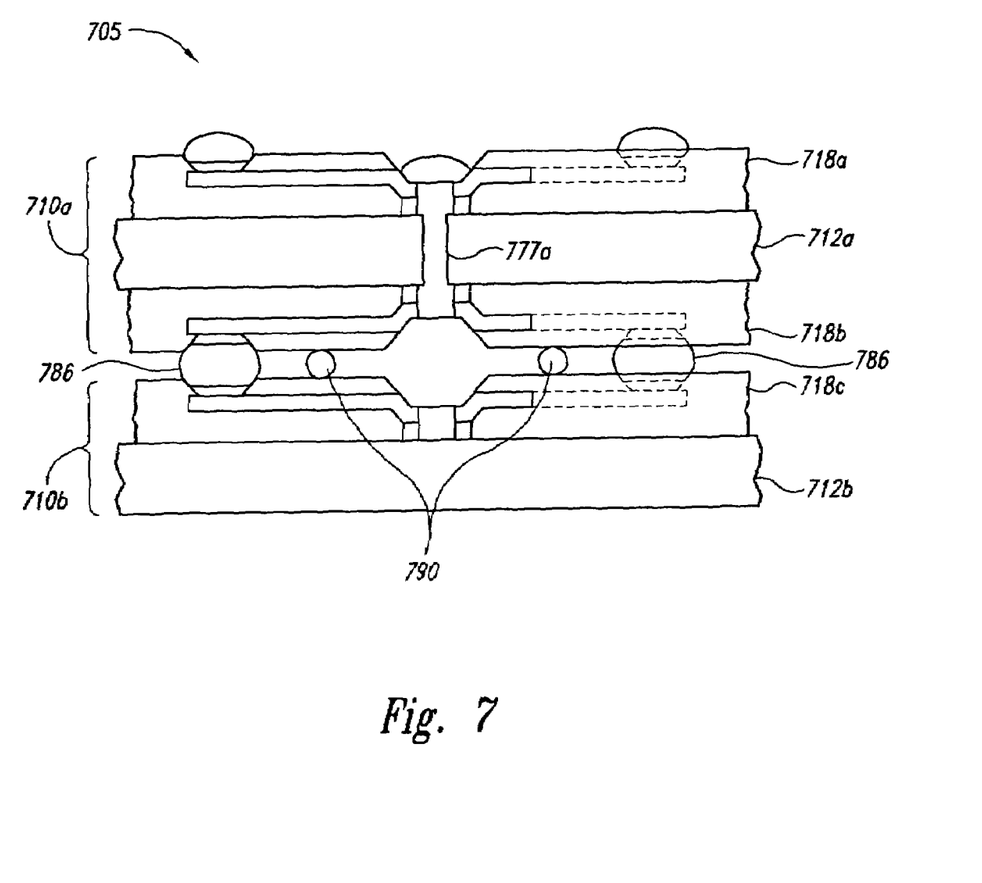
FIG. 7 is a schematic side cross-sectional view of a microelectronic device set configured in accordance with another embodiment of the invention.

FIG. 7 is a schematic side cross-sectional view of a microelectronic device set 705 configured in accordance with an embodiment of the invention. In one aspect of this embodiment, the microelectronic device set 705 includes a plurality of microelectronic devices 710 (individually identified as a first microelectronic device 710a and a second microelectronic device 710b) interconnected in a stacked-die arrangement. Aspects of the first microelectronic device 710a can be at least generally similar to corresponding aspects of the microelectronic devices 210b and 510 discussed above and illustrated in FIGS. 3G and 5C, respectively. For example, the first microelectronic device 710a can include a top or first RDL 718a disposed on a first surface of a die 712a, and a bottom or second RDL 718b disposed on a second surface of the die 712a. A plurality of interconnects 777a extend through the die 712a interconnecting the first RDL 718a to the second RDL 718b. The second microelectronic device 710b similarly includes a third RDL 718c disposed on a surface of a second die 712b.

In another aspect of this embodiment, solder balls 786 can be used to electrically connect the second RDL 718b of the first microelectronic device 710a to the third RDL 718c of the second microelectronic device 710b. Additionally, a suitable adhesive 790 or other compound can also be used to structurally attach the microelectronic devices 710 together in the illustrated stacked-die configuration.

One feature of aspects of the embodiments illustrated in FIGS. 6 and 7 is that the respective microelectronic devices 610, 710 are electrically connected without the need for wire-bonds. One advantage of this feature is that the added cost and complexity of wire-bonds is avoided. A further advantage of this feature is that the footprint of the microelectronic device sets 605, 705 can be reduced over comparable device sets having wire-bond interconnections.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of manufacturing a microelectronic device having a die with an integrated circuit, the method comprising:
   forming a bond-pad on the die, wherein the bond-pad is electrically coupled to the integrated circuit;
   forming a redistribution layer on the die, the redistribution layer including a conductive line having a first end portion attached to the bond-pad and a second end portion spaced apart from the bond-pad;
   forming a passage through the die, the bond-pad, and the first end portion of the conductive line; and
   depositing an electrically conductive material into at least a portion of the passage, wherein the electrically conductive material extends through the bond pad and contacts the bond-pad.

2. The method of claim 1, further comprising applying a passivation layer to at least a portion of the passage before depositing an electrically conductive material into at least a portion of the passage.

3. The method of claim 1, further comprising:
   cleaning the passage after forming the passage through the die, the bond-pad, and the first end portion of the redistribution layer; and
   applying a passivation layer to at least a portion of the passage before depositing an electrically conductive material into at least a portion of the passage.

4. The method of claim 1, further comprising applying a TiCL$_4$ TiN layer to at least a portion of the passage before depositing an electrically conductive material into at least a portion of the passage.

5. The method of claim 1, further comprising applying a wetting agent to at least a portion of the passage before depositing an electrically conductive material into at least a portion of the passage.

6. The method of claim 1, further comprising applying a Ni layer to at least a portion of the passage before depositing an electrically conductive material into at least a portion of the passage.

7. The method of claim 1, further comprising:
   applying a TiCL$_4$ TiN layer to at least a portion of the passage; and
   applying a Ni layer over at least a portion of the TiCL$_4$ TiN layer before depositing an electrically conductive material into at least a portion of the passage.

8. The method of claim 1, further comprising:
   applying a passivation layer to at least a portion of the passage;
   applying a TiCL$_4$ TiN layer over at least a portion of the passivation layer; and applying a Ni layer over at least a portion of the TiCL$_4$ TiN layer before depositing an electrically conductive material into at least a portion of the passage.

9. The method of claim 1 wherein forming the passage includes laser-cutting a through-hole completely through the die.

10. The method of claim 1 wherein the bond-pad includes a hole filled with a passivation material, and wherein forming the passage includes laser-cutting a through-hole completely through the die and the passivation material.

11. The method of claim 1, further comprising:
   forming a hole through the first end portion of the conductive line and the bond-pad; and
   filling the hole with a passivation material, wherein forming the passage through the die, the bond-pad, and the first end portion of the conductive line includes cutting a through-hole completely through the die and the passivation material.

12. The method of claim 1, further comprising:
   etching a hole through the first end portion of the conductive line and the bond-pad; and
   filling the hole with a passivation material, wherein forming the passage through the die, the bond-pad, and the first end portion of the conductive line includes laser-cutting a through-hole completely through the die and the passivation material.

13. The method of claim 1, further comprising forming a hole in the bond-pad before forming the passage through the die, the bond-pad, and the first end portion of the conductive line.

14. The method of claim 1, further comprising:
   forming a hole in the bond-pad before forming the passage through the die, the bond-pad, and the first end portion of the conductive line; and
   at least generally filling the first hole with a dielectric material, wherein forming the passage through the die, the bond-pad, and the first end portion of the conductive line includes forming the passage through the dielectric material.

15. A method of manufacturing a microelectronic device having a die with an integrated circuit, the method comprising:
   forming a bond-pad on the die, wherein the bond-pad is electrically coupled to the integrated circuit;
   forming a redistribution layer on the die, the redistribution layer including a conductive line having a first end portion attached to the bond-pad and a second end portion spaced apart from the bond-pad;
   forming a passage through the die, the bond-pad, and the first end portion of the conductive line;
   depositing an electrically conductive material into at least a portion of the passage, wherein the electrically conductive material extends through the bond pad;
   forming a ball-pad on the second end portion of the conductive line; and
   depositing a solder ball on the ball-pad.

16. A method of manufacturing a microelectronic device having a die with an integrated circuit and a bond-pad electrically coupled to the integrated circuit, the method comprising:
   etching a hole through the bond-pad;
   filling the hole with a passivation material;
   forming a passage completely through the die and the bond-pad, wherein forming the passage through the die and the bond-pad includes laser-cutting a through-hole through the die and the passivation material; and
   depositing an electrically conductive material into at least a portion of the passage, wherein the electrically conductive material contacts at least a portion of the bond-pad.

17. The method of claim 16 wherein the die includes a first surface and a second surface opposite to the first surface, wherein forming a bond-pad on the die includes forming a bond-pad at least proximate to the second surface, and wherein forming a passage through the die and the bond-pad includes applying a laser from the first surface of the die toward the second surface of the die to laser-cut a through-hole through the die.

18. The method of claim 16, further comprising applying a passivation layer to at least a portion of the passage before depositing an electrically conductive material into at least a portion of the passage.

19. The method of claim 16, further comprising applying a TiCL$_4$ TiN layer to at least a portion of the passage before depositing an electrically conductive material into at least a portion of the passage.

20. The method of claim 16, further comprising:
   applying a TiCL$_4$ TiN layer to at least a portion of the passage; and
   applying a Ni layer over at least a portion of the TiCL$_4$ TiN layer before depositing an electrically conductive material into at least a portion of the passage.

21. A method of forming a conductive interconnect in a microfeature workpiece having a die, the die having an integrated circuit and a bond-pad coupled to the integrated circuit, the method comprising:
   forming a conductive line electrically coupled to the bond-pad;
   forming a hole in the bond-pad;
   forming a via completely through the die in alignment with the hole in the bond-pad, wherein the via and the hole define a passage extending completely through the die, the bond-pad, and a portion of the conductive line; and
   depositing an electrically conductive material into at least a portion of the passage, wherein the electrically conductive material contacts at least a portion of the bond-pad.

22. The method of claim 21 further comprising insulating the die from the electrically conductive material in the passage.

23. The method of claim 21, further comprising applying an insulating layer to the die proximate to the passage to insulate the die from the electrically conductive material in the passage.

24. The method of claim 21, further comprising filling the hole in the bond-pad with a material, wherein forming a passage through the die and the bond-pad includes forming a passage through the die and the material filling the hole in the bond-pad.

25. The method of claim 21, further comprising filling the hole in the bond-pad with a passivation material, wherein forming a passage through the die and the bond-pad includes forming a passage through the die and the passivation material filling the hole in the bond-pad.

26. The method of claim 21 wherein forming a hole in the bond-pad includes forming a first hole having a first diameter, and wherein forming the passage includes laser-cutting a through-hole having a second diameter, the second diameter being less than the first diameter.

* * * * *